United States Patent [19]

Ogawa

[11] Patent Number: 5,324,984
[45] Date of Patent: Jun. 28, 1994

[54] SEMICONDUCTOR DEVICE WITH IMPROVED ELECTRODE STRUCTURE

[75] Inventor: Hisao Ogawa, Tokyo, Japan

[73] Assignee: NEC Corporation, Tokyo, Japan

[21] Appl. No.: 920,922

[22] Filed: Jul. 28, 1992

[30] Foreign Application Priority Data

Jul. 29, 1991 [JP] Japan ................................ 3-188499

[51] Int. Cl.$^5$ .................. H01L 21/22; H01L 27/082; H01L 29/40
[52] U.S. Cl. ................................ 257/588; 257/592; 257/593; 257/757
[58] Field of Search ............... 257/592, 593, 587, 588, 257/757

[56] References Cited

U.S. PATENT DOCUMENTS 4,795,722 1/1989 Welch et al. ...................... 257/757

OTHER PUBLICATIONS

"Optimization of Polysilicon Emitters for BiCMOS Transistor Design", IEEE Transactions on Electron Devices, vol. 37, No. 11, Nov. 1990, by I. R. Evans et al., pp. 2343–2349.
"Scaling the Silicon Bipolar Transistor for Sub-100-ps ECL Circuit Operation at Liquid Nitrogen Temperature", by Cressler et al., IEEE Transactions On Electron Devices, vol. 37, No. 3, Mar. 1990, pp. 680–691.
S. M. Sze; "Semiconductor Devices Physics and Technology"; 1985; pp. 109–111.

Primary Examiner—Rolf Hille
Assistant Examiner—Wael Fahmy
Attorney, Agent, or Firm—Burns, Doane, Swecker & Mathis

[57] ABSTRACT

In an open-hole section formed in a silicon oxide layer, a polycrystalline silicon layer, which will become a lower layer of an emitter electrode, is deposited and arsenic ions are implanted into it. Next, on top of the polycrystalline silicon layer, another polycrystalline silicon layer, which will become an upper layer of the emitter electrode, is deposited and implanted with a high density of arsenic ions. Through heat treatment, an N-type emitter diffusion layer is formed inside a P-type intrinsic base diffusion layer. By constructing the emitter electrode with 2 layers, the lower layer and upper layer, and by optimizing the impurity density in each of the layers, the characteristic irregularities of a bipolar transistor having minute emitter contact holes are reduced, and it is possible to increase the allowance of the formation conditions of the open-hole section which connects a wiring layer and to reduce the emitter resistance.

8 Claims, 3 Drawing Sheets

SEMICONDUCTOR DEVICE WITH IMPROVED ELECTRODE STRUCTURE

BACKGROUND OF THE INVENTION

1. Field of the Invention

This invention relates to a semiconductor device, and in more particularly to the construction of an emitter terminal or electrode of a bipolar transistor.

2. Description of the Prior Art

The fabrication process of a prior semiconductor device is explained with reference to the drawings.

FIG. 1A to 1D show a sectional view of a semiconductor chip showing the sequence of processes in order to explain the fabrication process of a prior semiconductor device.

As shown in FIG. 1A, arsenic ions are selectively implanted into the main surface of a P-type single crystal silicon substrate 1 using an acceleration energy of 70 keV and a dose of $3 \times 10^{15}$ to $1 \times 10^{16}$ cm$^{-2}$, and an N-type buried diffusion layer 2 is formed by performing heat treatment at a temperature of 1050° to 1150° C. for four hours. In the same way, boron ions are selectively implanted using an accelaration energy of 50 keV and a dose of $5 \times 10^{13}$ to $3 \times 10^{14}$ cm$^{-2}$, and a P-type buried diffusion layer 3 is formed by performing heat treatment at a temperature of 980° to 1050° C. for one hour.

Next, an N-type epitaxial layer 4 with a specific resistance of 1Ω cm is formed with a thickness of 1.5 to 2.5 μm on top of the P-type single crystal silicon substrate 1 which includes the N-type buried diffusion layer 2 and the P-type buried diffusion layer 3, and a P-type diffusion layer 5 is selectively formed extending from the main surface of the N-type epitaxial layer 4 to the P-type buried diffusion layer 3, insulating and isolating the elements. Then, a silicon oxide layer (field oxide film) 6 is formed with a thickness of 600 to 900 nm, using a selective oxidation method, on the surface of the N-type epitaxial layer 4, insulating and isolating the elements, and partitioning off both a first element formation region 7 and a second element formation region 8. Next, a 10 to 20 nm thick silicon oxide layer 9 is formed on the surface of the N-type epitaxial layer 4 of both the first and second element formation regions 7 and 8 using thermal oxidation at a temperature of 900° C. and in an H$_2$-O$_2$ atmosphere. Then, after the silicon oxide layer 9 of the first element formation region 7 has been selectively removed, a 250 to 450 nm thick polycrystalline silicon layer 10 with phosphorus doped is selectively formed and will act as a collector electrode. For example, in a semiconductor device with bipolar elements and MOS elements configured on the same semiconductor substrate, the silicon oxide layer 9 is formed using the same process as a gate oxide film, and the polycrystalline silicon layer 10 is formed simultaneously with the gate electrode. Doping of phosphorus into the polycrystalline silicon layer 10 is performed using diffusion at 830° to 930° C., also at the same time, phosphorus is diffused into the N-type epitaxial layer 4 passing through the polycrystalline silicon layer 10 forming an N-type collector diffusion layer 11. Next, using an acceleration energy of 10 to 30 keV and a dose of $1 \times 10^{13}$ to $5 \times 10^{13}$ cm$^{-2}$, boron ions are implanted into the surface of the N-type epitaxial layer 4 of the second element formation region 8 to form a P-type intrinsic base diffusion layer 12, and boron ions are selectively implanted into a portion of the P-type intrinsic base diffusion layer 12 using an acceleration energy of 10 to 30 keV and a dose of $3 \times 10^{15}$ to $1 \times 10^{16}$ cm$^{-2}$ to form a P-type base extrinsic diffusion layer 13.

Next, as shown in FIG. 1B, a 250 nm thick silicon oxide layer 14 is deposited on all surfaces using a CVD (chemical vapor deposition) method, and an open-hole region is selectively prepared in the silicon oxide layer 14 above top of the P-type intrinsic base diffusion layer 12, and in the open-hole region, a 200 nm polycrystalline silicon layer 15 with arsenic doped is selectively formed as an emitter electrode. Arsenic is doped into the polycrystalline silicon layer 15 by implanting arsenic ions using an acceleration energy of 70 keV and a dose of $5 \times 10^{15}$ to $2 \times 10^{16}$ cm$^{-2}$, and then by forcing the arsenic using heat treatment at 900° to 950° C. an N-type emitter diffusion layer 16 is formed inside the P-type intrinsic base diffusion layer 12.

As shown in FIG. 1C, an interlayer insulating film 17 comprised of two layers is prepared by depositing in succession using the CVD method, a 100 nm thick silicon oxide layer and a 500 nm thick BPSG layer on top of the silicon oxide layer 14 including the polycrystalline silicon layer 15, and then in order to smooth the surface, heat treatment is performed at 850° to 920° C. after which holes are selectively opened in the interlayer insulating film 17 and open-hole regions 18, 19, and 20 are selectively formed extending to the collector terminal or electrode 10, emitter terminal or electrode 15 and the P-type base extrinsic diffusion layer 13.

Next, as shown in FIG. 1D, an aluminum layer is deposited on the surfaces which contain the open-hole regions 18, 19, and 20, it is then patterned and the wirings 21 connecting the collector electrode 10, the emitter electrode 15 and the P-type base extrinsic diffusion layer 13 are formed interconnecting the elements in the semiconductor device.

In the prior semiconductor device, the surface of the interlayer insulating film 17 needed to be flattened sufficiently in order to prevent shorts and breaks in the wiring layers 21 which are formed in a later process. The vertical distances from the surface of the interlayer insulating film 17 to the collector electrode 10, the emitter electrode 15 and the P-type base extrinsic diffusion layer 13 are 850 nm, 600 nm and 850 nm respectively at the time the interlayer insulating film 17 is deposited. However, after heat treatment, they change to approximately 900 nm, 500 nm and 950 nm. If the open-hole regions 18, 19 and 20 are formed by, for example, plasma etching using a CHF$_3$—O$_2$ family gas, it is necessary to set etching conditions which match the film thickness of the silicon oxide layers on top of the P-type base extrinsic diffusion layer 13. When the etching ratio for the ply crystalline silicon layers 10 and 15 and silicon oxide layers 6 and 14 using the gas family mentioned above is 1:6, the emitter electrode 15 is etched and removed by at least 80 nm [(950−500)/6=75 nm] thick during plasma etching. Under the above conditions, the thickness of the emitter electrode 15 is actually reduced from 200 nm to 120 nm. This differs depending on how large or small the heat history is after the aluminum wiring 21 is formed in a later process, however, in order that there are no changes in the bipolar transistor characteristics due to the reaction of the aluminum wiring layer 21 with the polycrystalline silicon of the emitter electrode 15, it is necessary that the film thickness of the emitter electrode 15 be 70 to 100 nm after the open-hole region 19 is formed. Therefore, a film thickness for the emitter electrode 15 of 180 nm or more, or if the irregularities occurring during fabricating are considered, a thickness of 200 nm or more is desirable.

On the other hand, in order to make high-integration and high-performance of the elements possible, the open-hole region (emitter contact hole) formed on the silicon oxide layer 14 is gradually reduced. For example, for a 250 nm thick silicon oxide layer 14, a width of 700 nm and a length of 3 μm are applicable dimensions. In order to reduce the irregularities in the element characteristics of the bipolar transistor, it is necessary that the thickness of the polycrystalline silicon layer 15 is the same as that of the silicon oxide layer 14, and in order to reduce the irregularities of the quantity of arsenic ions implanted into the emitter electrode 15 in a later process, it is necessary that the width of the selected open-hole be three times or more the thickness of the emitter electrode 15. Thus, it is necessary that the thickness of the emitter electrode 15 be 230 nm or less.

In the prior semiconductor device described above, irregularities in the characteristics of the bipolar transistor are large due to irregularities during fabricating. Also, there is a problem in that product yield drops easily.

Also, in order to make the width of the emitter contact holes even smaller, a problem exists in that the reduction in the width cannot be dealt with expansion of the prior fabricating technology, i.e. with only a reduction in the dimensions in the vertical and horizontal directions.

SUMMARY OF THE INVENTION

The object of this invention is to provide a semiconductor device which together with reducing irregularities in the characteristics of a bipolar transistor comprised of emitter contact holes of minute dimensions, improves the etching allowance when forming the open-hole section which connects the wiring layer, reduces the emitter resistance, and improves the levelness of the interlayer insulating film on top of the emitter electrode.

The object of this invention mentioned above is accomplished by providing a semiconductor device which comprises one conductivity type semiconductor substrate, a reverse conductivity type buried diffusion layer formed on the main surface of the semiconductor substrate, a reverse conductivity type epitaxial layer formed on the surface which includes the buried diffusion layer, one conductivity type element isolation layer which is formed in the epitaxial layer surrounding the buried diffusion layer and which isolates the element formation regions, a field oxide film formed on the surface of the epitaxial layer and for forming first and second element formation regions by partitioning the surface of the element formation regions, a reverse conductivity type collector diffusion layer formed on the first element formation region and which connects the buried diffusion layer, one conductivity type intrinsic base diffusion layer formed below the surface of the epitaxial layer in the second element formation region, an interlayer insulating film formed on the surface which includes the top of the intrinsic base diffusion layer, a reverse conductivity type emitter diffusion layer formed below the surface of the intrinsic base diffusion layer in an open-hole section formed in the interlayer insulating film, and an emitter electrode layer with two-layer construction having a lower polycrystalline silicon layer which has reverse conductivity type impurities and connects the emitter diffusion layer of the open-hole section and an upper layer selected from a polycrystalline silicon layer which has a higher density of reverse conductivity type impurities than that of the lower polycrystalline silicon layer or a refractory metal silicide layer.

BRIEF DESCRIPTION OF THE DRAWINGS

The aforementioned and other objects, features and advantages of the present invention will become more apparent form the following description taken with reference to the accompanying drawings, wherein.

DESCRIPTION OF THE PREFERRED EMBODIMENTS

Figure 1A:
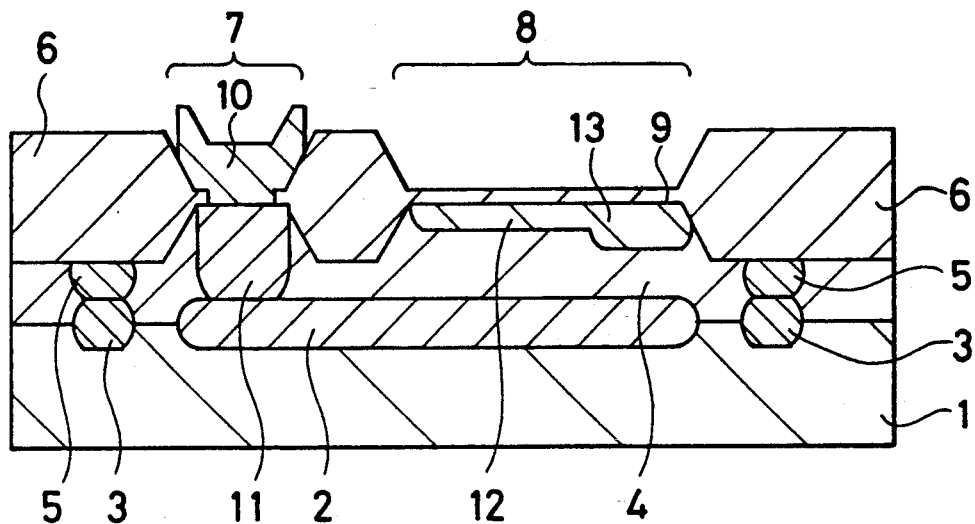
FIGS. 1A to 1D are sectional views of a semiconductor chip which shows the sequence of processes for describing the fabrication process of a prior semiconductor device.
Figure 1B:
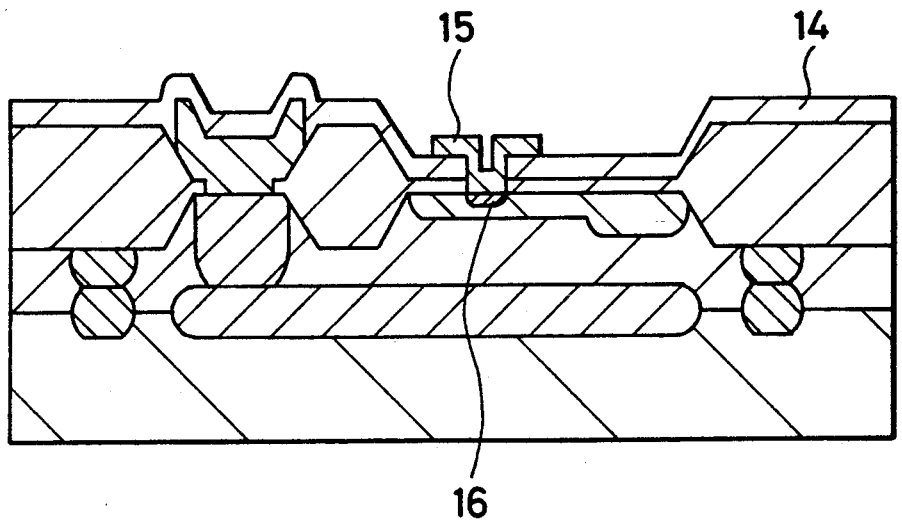

Next, this invention will be described in more detail with reference to the drawing.

Figure 2:
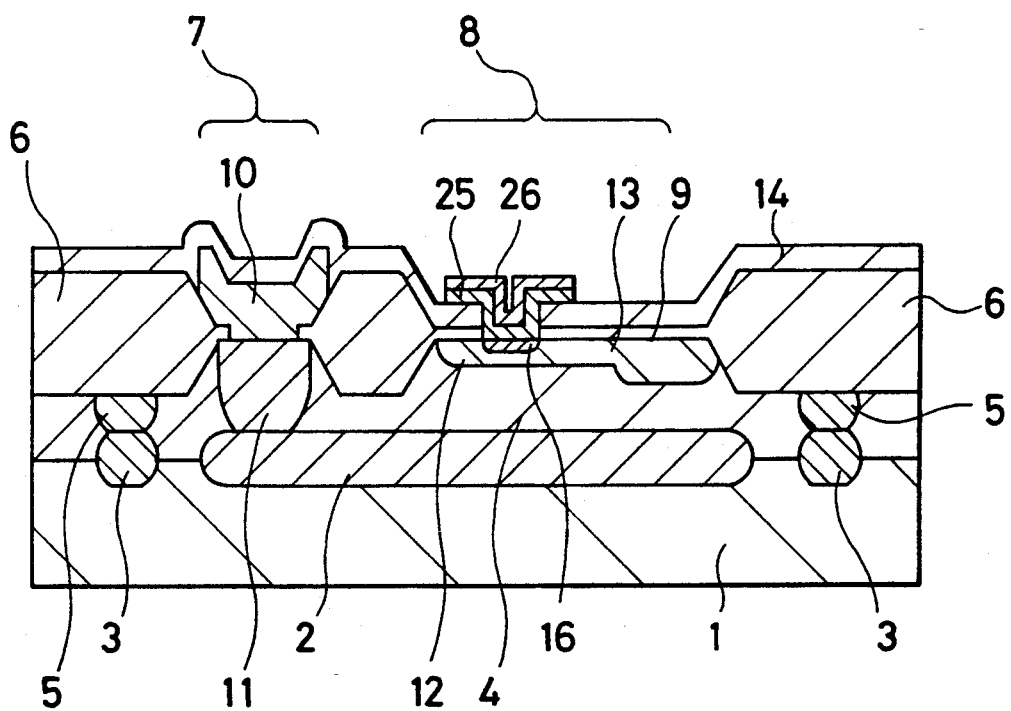
FIG. 2 is a sectional view of a semiconductor chip which gives an embodiment of this invention.

As shown in FIG. 2, a semiconductor device according to this invention comprises, a P-type single crystal silicon substrate 1; an N-type buried diffusion layer 2 and a P-type buried diffusion layer 3 which are formed on the main surface of the substrate 1; an N-type epitaxial layer 4; P-type diffusion layer 5 used for isolating element formation regions; a silicon oxide layer 6 (field oxide film) formed on the surface of the N-type epitaxial layer 4; an N-type collector diffusion layer 11; a phosphorus doped, polycrystalline silicon layer 10; a P-type intrinsic base diffusion layer 12 and a P-type base extrinsic diffusion layer 13 which are adjacent to each other; a silicon oxide layer 14; an N-type emitter diffusion layer 16; and an emitter electrode layer having two-layer construction of which the lower layer is a polycrystalline silicon layer 25 with N-type impurities and the upper layer is selected from a polycrystalline silicon layer 26 which has a higher density of N-type impurities than the above polycrystalline silicon layer 25 or a tungsten silicide layer.

The above-mentioned N-type epitaxial layer 4 is formed on the substrate 1 which includes the buried diffusion layers 2 and 3. The P-type diffusion layer 5 is formed on the P-type buried diffusion layer 3, running from the surface of the N-type epitaxial layer 4 to the top of the P-type buried diffusion layer 3. The silicon oxide layer 6 partitions the surface of the element formation region to form a first element formation region 7 and a second element formation region 8. The N-type collector diffusion layer 11 formed in the first element formation region 7 connects to the buried diffusion layer 2. On the surface of the N-type collector diffusion layer 11, is formed the phosphorus-doped polycrystalline silicon layer 10. In the second element formation region 8, the P-type intrinsic base diffusion layer 12 and P-type base extrinsic diffusion layer 13 which are adjacent to each other are formed inside the surface of the N-type epitaxial layer 4. On the surface of the silicon oxide layer 6 including the intrinsic base diffusion layer 12 and the polycrystalline silicon layer 10, is formed the silicon oxide layer 14. An open-hole section is formed in the silicon oxide layer 14 above the top of the intrinsic base diffusion layer 12. The N-type emitter diffusion layer 16 is formed inside the surface of the intrinsic base diffusion layer 12 in the open-hole section. The emitter electrode layer having the two-layer construction is connected to the emitter diffusion layer 16 and its upper layer 26 is built-up on the top of the lower layer 25. The tungsten silicide layer may be replaced with silicide of a refractory or high melting metal such as titanium, molybdenum or the like.

The fabrication process of this embodiment of the invention will be described below.

According to the same process as shown in the example of the prior art, an N-type buried diffusion layer 2 and a P-type buried diffusion layer 3 are selectively formed on a P-type single crystal silicon substrate 1, and then an N-type epitaxial layer 4 is grown on the surface of the P-type single crystal silicon substrate 1 which includes the N-type buried diffusion layer 2 and P-type buried diffusion layer 3. Next, a P-type diffusion layer 5 which goes from the main surface of the N-type epitaxial layer 4 to the P-type buried diffusion layer 3 is selectively formed and is used as an insulating isolation between elements. To isolate and insulate between the elements, a silicon oxide layer 6 (field oxide film) is selectively formed, using oxidation, on the surface of the N-type epitaxial layer 4, and partitions off a first element formation region 7 and a second element formation region 8. Then, a silicon oxide layer 9 is formed on the surface of the N-type epitaxial layer 4 in the first and second element formation regions 7 and 8. Holes are opened selectively in the silicon oxide layer 9 in the first element formation region 7 and a polycrystalline silicon layer 10 with phosphorus doped is selectively deposited therein, and by using heat treatment, impurities are diffused into the surface of the N-type epitaxial layer 4 to form an N-type collector diffusion layer 11. Next, boron ions are implanted into the surface of the N-type epitaxial layer 4 in the second element formation region 8 to form a P-type intrinsic base diffusion layer 12 and a P-type base extrinsic diffusion layer 13 which are adjacent to each other. Then, a silicon oxide layer 14 is deposited onto the surface which includes the polycrystalline silicon layer 10 using a CVD method, and an open-hole section is selectively formed in the silicon oxide layer 14 on top of the P-type intrinsic base diffusion layer 12. Next, a polycrystalline silicon layer 25, which will become the lower layer of the emitter electrode, is deposited on the surface that includes the open-hole section to a film thickness of 150 nm, thinner than was done formerly. Arsenic ions are then implanted using an acceleration energy of 70 keV and a dose quantity of $4 \times 10^{15}$ to $15 \times 10^{16}$ cm$^{-2}$, and then on top of the polycrystalline silicon layer 25, another polycrystalline silicon layer 26, which will become the upper layer of the emitter electrode, is deposited to a thickness of 150 nm, and it is patterned by implanting arsenic ions using an acceleration energy of 70 keV and a dose quantity of $5 \times 10^{15}$ to $2 \times 10^{16}$ cm$^{-2}$. Using heat treatment at a temperature of 900° to 950° C. impurities are diffused into the P-type intrinsic base diffusion layer 12 to form an N-type emitter diffusion layer 16.

Figure 1C:
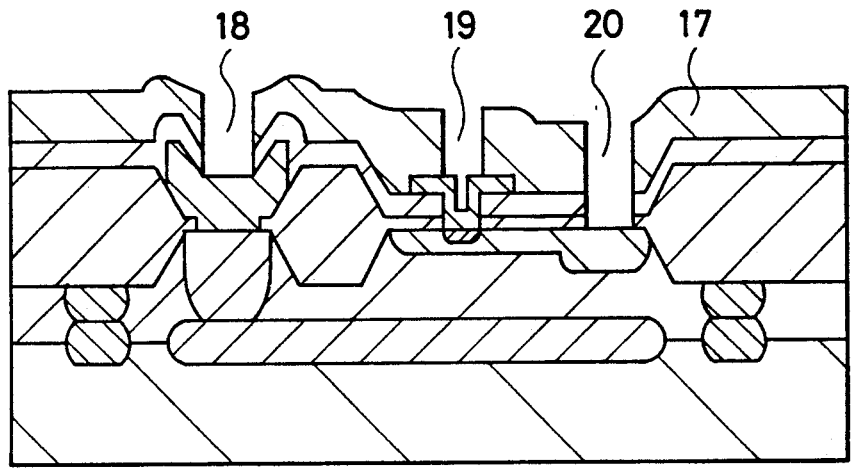
Figure 1D:
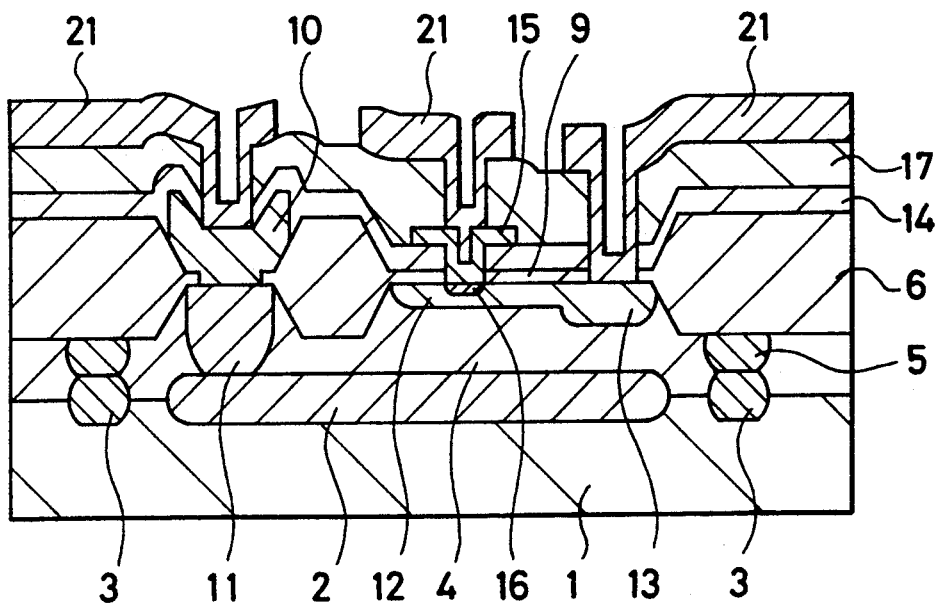

Thereafter, an interlayer insulating film is formed thereon, holes are selectively opened to form open-hole regions, and an aluminum layer is deposited thereon and then patterned to form wirings, according to a process similar to that as shown in FIGS. 1C and 1D.

In this embodiment, the characteristics of the bipolar transistor depend on the film thickness of the lower-layer polycrystalline silicon layer 25 and the amount of arsenic ions in it. The film thickness of the layer 25 is preferably in the range of 70 to 200 nm and the density of impurity (arsenic ions) is preferably in the range of $1 \times 10^{20}$ to $1.5 \times 10^{21}$/cm$^3$. Also, the upper-layer polycrystalline silicon layer 26 is made as thin as possible to reduce emitter resistance and so that the lower polycrystalline silicon layer 25 is not removed by etching during post-processing when forming the open-hole section which will be used as the contact. It is good if the density of impurities of the upper polycrystalline silicon layer 26 is higher than that of the lower polycrystalline silicon layer 25 after heat treatment for forming the N-type emitter diffusion layer 16, and if necessary it is possible to reduce the dose quantity of arsenic implanted.

In the embodiment described above, one example is given for P-type and N-type layers, however, by reversing the impurity types, it is possible, using the same method, to form an N-type layer in place of the P-type layer and a P-type layer in place of the N-type layer.

As shown above, in this invention, by constructing an emitter electrode with two polycrystalline silicon layers 25 and 26 which have different densities of impurities, it is possible to form a stable bipolar transistor which has very minute emitter contact holes, and at the same time, by increasing the total film thickness of the polycrystalline silicon layers 25 and 26, it is possible to improve the etching allowance when forming the open-hole section for a contact hole in the interlayer insulating film.

In place of the upper polycrystalline silicon layer 26, a tungsten silicide layer may be formed. In that case, the layer resistance of the tungsten silicide layer, when compared with the polycrystalline silicon layer with arsenic doped, is reduced to approximately 1/10, and the etching ratio is reduced by approximately ½ using the aforementioned plasma etching conditions, whereby, besides having the advantages mentioned above, the parasitic resistance of the emitter can be reduced. Furthermore, the open-hole section in this invention may be formed above the emitter electrode but not right over the emitter contact and also, by extending the emitter electrode to the top of the silicon oxide layer 6, it is then possible to form the open-hole section for contacting the emitter electrode on top of the silicon oxide layer 6. On the other hand, the open-holes 19 in the prior art have been selectively formed right over the emitter contact for the purpose of reducing the parasitic resistance of the prior emitter. Moreover, by reducing the film thickness of the tungsten silicide layer by ½ when compared with the above embodiment, it is possible to improve the levelness of the interlayer insulation film in post-processing.

As explained above, in this invention, by constructing an emitter electrode by building-up two polycrystalline silicon layers with different densities of impurities, the impurity density of the emitter diffusion layer is controlled and together with being able to reduce the characteristic irregularities in a bipolar transistor having very minute emitter contact holes, the allowance in the formation conditions for selectively forming the open-holes which connect the wiring layer, is enlarged making it possible to reduce the emitter resistance even more. Also, it is very effective in improving the levelness of the interlayer insulation film on top of the emitter electrode.

What is claimed is:
1. A semiconductor device comprising:
    a first conductivity type semiconductor substrate;
    a reverse conductivity type diffusion layer buried in a surface of said substrate;

a reverse conductivity type epitaxial layer formed in said surface;

a first conductivity type element isolation layer formed around said buried diffusion layer in said epitaxial layer to isolate an element formation region;

a field oxide film formed on the surface of said epitaxial layer to define first and second element formation subregions by partitioning said element formation region;

a reverse conductivity type collector diffusion layer form in said first element formation subregion and connected to said buried diffusion layer;

a first conductivity type intrinsic base diffusion layer formed inside said epitaxial layer in said second element formation region;

an interlayer insulating film formed on said field oxide film;

a reverse conductivity type emitter diffusion layer formed at a surface of said intrinsic base diffusion layer at a site where an open-hole formed in said interlayer insulating film reaches; and a two-layered emitter electrode layer including a lower polycrystalline silicon layer having reverse conductivity type impurities and connecting said emitter diffusion layer and an upper layer including a polycrystalline silicon layer having a higher density of reverse conductivity type impurities than that of said lower polycrystalline silicon layer.

2. A semiconductor device as defined in claim 1 wherein said first conductivity type semiconductor substrate is a P-type substrate, said buried reverse conductivity type diffusion layer is an N-type buried diffusion layer, said reverse conductivity type epitaxial layer is an N-type epitaxial layer, said first conductivity type element isolation layer is a P-type element isolation layer, said reverse conductivity type collector diffusion layer is an N-type collector diffusion layer, said first conductivity type intrinsic base diffusion layer is a P-type intrinsic base diffusion layer, said reverse conductivity type emitter diffusion layer is an N-type emitter diffusion layer, and said reverse conductivity type impurities are N-type impurities.

3. A semiconductor device as defined in claim 1 wherein said first conductivity type semiconductor substrate is an N-type substrate, said buried reverse conductivity type buried diffusion layer is a P-type buried diffusion layer, said reverse conductivity type epitaxial layer is a P-type epitaxial layer, said first conductivity type element isolation layer is an N-type element isolation layer, said reverse conductivity type collector diffusion layer is a P-type collector diffusion layer, said first conductivity type intrinsic base diffusion layer is an N-type intrinsic base diffusion layer, said reverse conductivity type emitter diffusion layer is a P-type emitter diffusion layer, and said reverse conductivity type impurities are P-type impurities.

4. A semiconductor device as defined in claim 1 wherein said first conductivity type substrate is a P-type single crystal silicon substrate, said field oxide film is a silicon oxide film, and said interlayer insulating film is a silicon oxide film.

5. A semiconductor device comprising:
a first conductivity type semiconductor substrate;
a reverse conductivity type and a first conductivity type diffusion layer both buried in a surface of said substrate;

a reverse conductivity type epitaxial layer formed in said surface;

a first conductivity type element isolation layer running from a surface of said epitaxial layer to said buried first conductivity diffusion layer to isolate an element formation region;

a field oxide film formed on said epitaxial layer to define first and second element formation subregions by partitioning said element formation region;

a reverse conductivity type collector diffusion layer formed in said first element formation subregion and connected to said buried diffusion layer;

a phosphorus doped polycrystalline silicon layer, said layer being formed on a surface of said collector diffusion layer;

a first conductivity type intrinsic base diffusion layer and a conductivity type extrinsic base diffusion layer adjacent to each other, said two layers being formed inside said epitaxial layer in said second element formation subregion;

an interlayer insulating film formed on said field oxide film and said phosphorus-doped polycrystalline silicon layer;

a reverse conductivity type emitter diffusion layer formed at a surface of said intrinsic base diffusion layer at a site where an open-hole formed in said interlayer insulating film reaches; and a two-layered emitter electrode layer including a lower polycrystalline silicon layer having reverse conductivity type impurities therein and connecting with said emitter diffusion layer, and an upper layer selected including a polycrystalline silicon layer having a higher density of reverse conductivity type impurities than that of said lower polycrystalline silicon layer.

6. A semiconductor device as defined in claim 5 wherein said first conductivity type semiconductor substrate is a P-type substrate, said buried reverse conductivity type diffusion layer is an N-type buried diffusion layer, said reverse conductivity type epitaxial layer is an N-type epitaxial layer, said first conductivity type element isolation layer is a P-type element isolation layer, said reverse conductivity type collector diffusion layer is an N-type collector diffusion layer, said first conductivity type intrinsic base diffusion layer is a P-type intrinsic base diffusion layer, said reverse conductivity type emitter diffusion layer is an N-type emitter diffusion layer, and said reverse conductivity type impurities are N-type impurities.

7. A semiconductor device as defined in claim 5 wherein said first conductivity type semiconductor substrate is an N-type substrate, said buried reverse conductivity type diffusion layer is a P-type buried diffusion layer, said reverse conductivity type epitaxial layer is a P-type epitaxial layer, said first conductivity type element isolation layer is an N-type element isolation layer, said reverse conductivity type collector diffusion layer is a P-type collector diffusion layer, said first conductivity type intrinsic base diffusion layer is an N-type intrinsic base diffusion layer, and said reverse conductivity type impurities are P-type impurities.

8. A semiconductor device as defined in claim 5 wherein said first conductivity type substrate is a P-type single crystal silicon substrate, said field oxide film is a silicon oxide film, and said interlayer insulating film is a silicon oxide film.

* * * * *